(12) United States Patent
Lindert et al.

(10) Patent No.: US 7,060,576 B2
(45) Date of Patent: Jun. 13, 2006

(54) EPITAXIALLY DEPOSITED SOURCE/DRAIN

(75) Inventors: Nick Lindert, Beaverton, OR (US); Anand S. Murthy, Portland, OR (US); Justin K. Brask, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/692,696

(22) Filed: Oct. 24, 2003

(65) Prior Publication Data

US 2005/0087801 A1  Apr. 28, 2005

(51) Int. Cl.
  H01L 21/337 (2006.01)
  H01L 21/8238 (2006.01)
  H01L 21/336 (2006.01)
(52) U.S. Cl. .............. 438/300; 438/194; 438/222
(58) Field of Classification Search ........ 438/194–199, 438/44, 222, 300–305
See application file for complete search history.

(56) References Cited

U.S. PATENT DOCUMENTS

| | | | | |
|---|---|---|---|---|
| 5,384,497 A | * | 1/1995 | Britton et al. | 326/44 |
| 5,998,835 A | * | 12/1999 | Furukawa et al. | 257/408 |
| 6,159,815 A | * | 12/2000 | Lustig et al. | 438/305 |
| 6,214,679 B1 | | 4/2001 | Murthy et al. | |
| 6,342,421 B1 | | 1/2002 | Mitani et al. | |
| 6,605,498 B1 | * | 8/2003 | Murthy et al. | 438/197 |
| 6,797,556 B1 | * | 9/2004 | Murthy et al. | 438/231 |

FOREIGN PATENT DOCUMENTS

| | | |
|---|---|---|
| JP | 63 013379 | 6/1988 |
| WO | WO 00/30169 | 5/2000 |

OTHER PUBLICATIONS

S. Gannavaram et al., *Low Temperature (≦ 800° C) Recessed Junction Selective Silicon-Germanium Source/Drain Technology for sub-70 nm CMOS;* International Electron Devices Meeting 2000, IEDM, Technical Digest, San Francisco, CA, Dec. 10-13, 2000, IEEE, US, Dec. 10, 2000, pp. 437-440.

* cited by examiner

Primary Examiner—Cuong Nguyen
(74) Attorney, Agent, or Firm—Trop, Pruner & Hu, PC

(57) ABSTRACT

An epitaxially deposited source/drain extension may be formed for a metal oxide semiconductor field effect transistor. A sacrificial layer may be formed and etched away to undercut under the gate electrode. Then a source/drain extension of epitaxial silicon may be deposited to extend under the edges of the gate electrode. As a result, the extent by which the source/drain extension extends under the gate may be controlled by controlling the etching of the sacrificial material. Its thickness and depth may be controlled by controlling the deposition process. Moreover, the characteristics of the source/drain extension may be controlled independently of those of the subsequently formed deep or heavily doped source/drain junction.

17 Claims, 3 Drawing Sheets

EPITAXIALLY DEPOSITED SOURCE/DRAIN

BACKGROUND

This invention relates generally to metal oxide semiconductor field effect transistors.

Metal oxide semiconductor field effect transistors include a gate that is self-aligned with a source/drain. The source/drain may include a deeper or heavily doped region and a shallower and lightly doped region, sometimes called a tip or source/drain extension.

Gate underlap is the amount by which the source/drain material diffuses under the gate after ion implantation and subsequent heat processing. After implantation, the material that is implanted is exposed to heat which causes the material to move downwardly into the substrate and, to a lesser extent, laterally under the gate. Thus, in a system using an ion implanted source/drain extension, the amount of underdiffusion is determined as a function of junction depth.

It is desirable to have relatively shallow junction depth for the source/drain extension to support smaller transistor dimensions. Usually, in source/drain extension implantation techniques, the minimum tip junction depths are determined by the necessary gate underlap.

The shallower the source/drain extension, generally the shorter the gate lengths that may be utilized without increasing off-state leakage currents. Extension doping under the gate edge is needed to ensure a low resistance path between the inversion layer under the gate and the highly doped source/drain extension region. The low resistance is needed for a high drive currents, which are critical for high circuit switching speeds.

Thus, there is a need for better ways to make source/drain junctions of field effect transistors.

DETAILED DESCRIPTION

Figure 1:
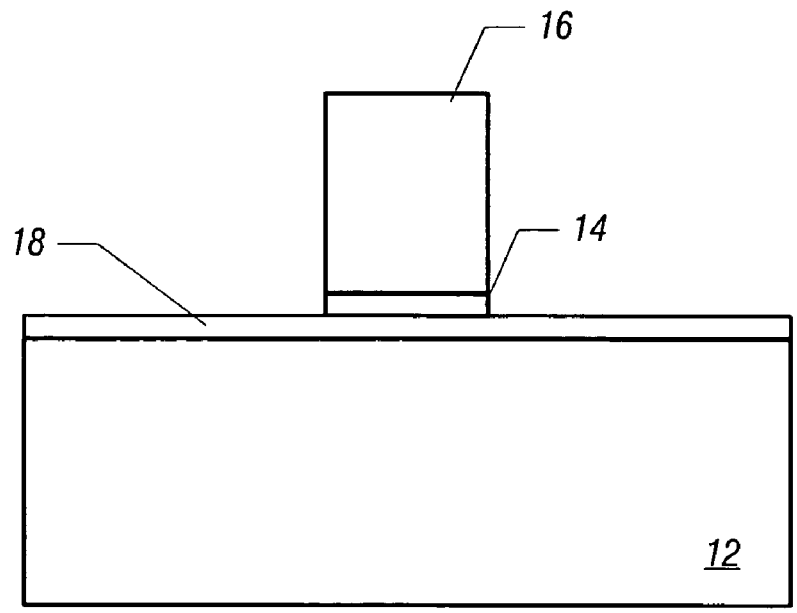
FIG. 1 is a greatly enlarged, cross-sectional view at one stage of manufacture.

Referring to FIG. 1, a heavily doped semiconductor substrate 12 may be covered by a sacrificial, undoped, or lightly doped epitaxial silicon layer 18. The layer 18 may be less than 500 Angstroms thick in one embodiment. A gate electrode structure including a gate 16 formed over a gate dielectric 14 may be defined on the epitaxial silicon layer 18.

The selective deposition of the sacrificial epitaxial silicon layer 18 may be carried out, for example, using dichlorosilane-based chemistry in a single wafer chemical vapor deposition reactor, such as an Epsilon 3000 epitaxial reactor, available from ASM International NV, Bilthoven, Netherlands. The film may be deposited with gas flows of 150–200 sccm of dichlorosilane, 100–150 sccm of HCl, 20 slm of $H_2$ at 825° C. in a processed pressure of 20 Torr. Under these processing conditions, a deposition rate of 10–15 nanometers per minute may be achieved for silicon on exposed substrate while achieving selectivity to spacer and oxide regions. Other deposition techniques may also be used.

The arrangement shown in FIG. 1 is sometimes called a delta doped transistor. Because there is relatively high doping below the epitaxial layer 18, a large delta or change in concentration occurs at the interface between the substrate 12 and the epitaxial silicon layer 18.

Figure 2:
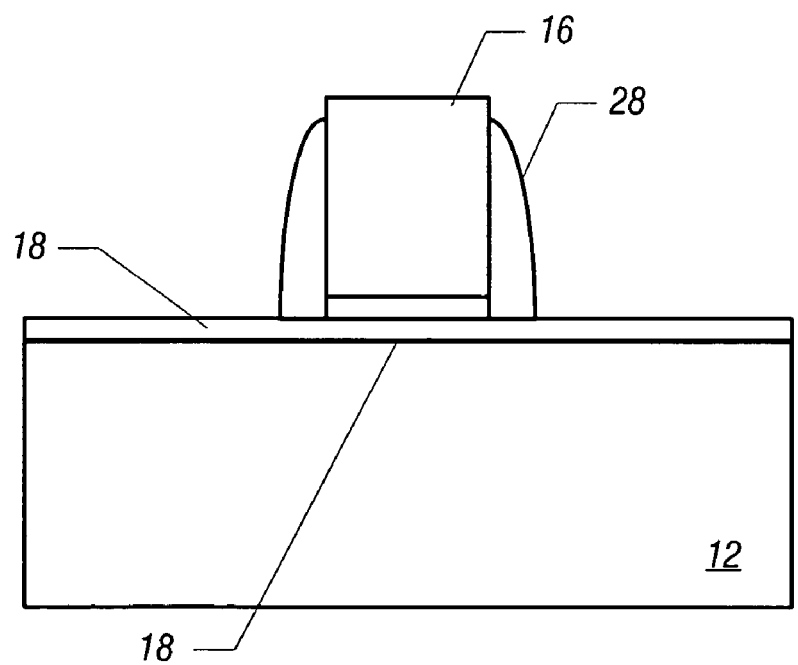
FIG. 2 is an enlarged, cross-sectional view at a subsequent stage of manufacture in accordance with one embodiment of the present invention.

The structure shown in FIG. 1 may be covered by a spacer material and then anisotropically etched to form the sidewall spacers 28 shown in FIG. 2. Some limited etching of the epitaxial silicon 18 may occur at the same time depending on the selectivity of the spacer etch.

Figure 3:
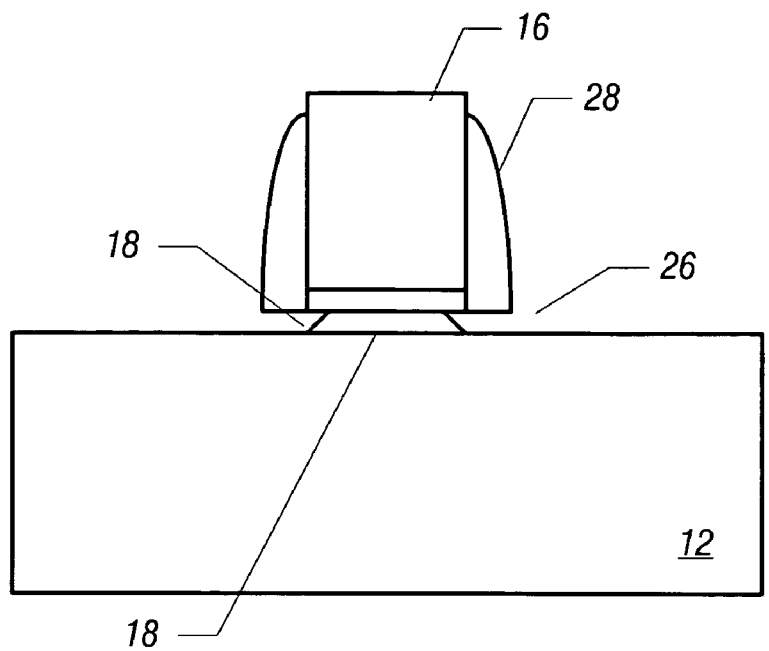
FIG. 3 is an enlarged, cross-sectional view at still a subsequent stage of manufacture in accordance with one embodiment of the present invention.

After spacer formation, a selective wet etch may remove the exposed portions of the epitaxial silicon layer 18 and may continue etching under the gate 16 to achieve the undercut structure shown in FIG. 3. The extent of gate 16 undercut can be controlled by adjusting the etch time.

The epitaxial silicon layer 18 may be selectively etched with a variety of hydroxide-based solutions, for example. However, for high selectivity of the undoped or lightly doped layer 18 to the heavily doped substrate 12, relatively mild processing conditions may be employed.

In one embodiment, an aqueous ammonium hydroxide solution in the concentration range of 2 to 10 percent by volume at 20° C. may be used together with sonication. The sonication may be provided by a transducer that dissipates ultra or megasonic energy with a power of 0.5 to 5 watts per $cm^2$ in one embodiment of the present invention. Since the delta doped transistor has a heavily doped region below the undoped region, it may serve as an etch stop layer for the wet etch.

Figure 4:
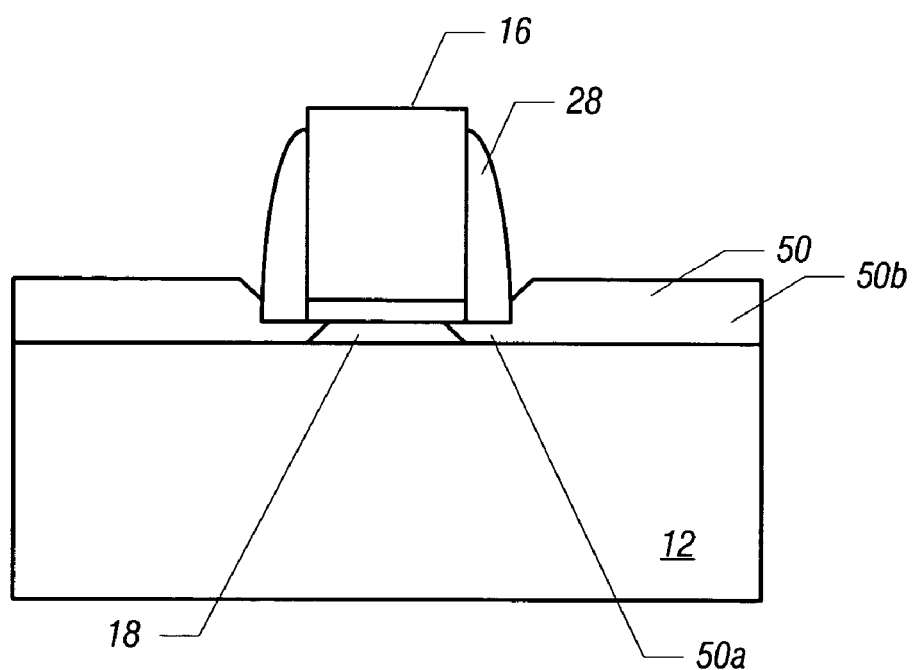
FIG. 4 is an enlarged, cross-sectional view at a subsequent stage of manufacture in accordance with one embodiment of the present invention.

After the wet etch undercut, a doped selective epitaxial silicon layer 50 may be grown. A shallow, highly doped source/drain extension 50a laterally extends the desired distance under the gate 16 edge and the sidewall spacer 28, as shown in FIG. 4. A thicker source/drain region 50b is aligned with the edge of the spacer 28 and extends away from the spacer 28. The spacer 28 enables the length of the extension 50a to be tailored and allows the thickness of the layer 50 to expand without shorting to the gate 16. The thicker region 50b reduces resistance of the region 50 and brings the lower resistance region close to the edge of the gate 16.

In forming the P-type MOS (PMOS) transistor, the source/drain extension 50a and raised source/drain 50b may be formed by selectively depositing epitaxial boron doped silicon or silicon germanium with a germanium concentration of up to 30 percent, as one example. Under the processing conditions of 100 sccm of dichlorosilane, 20 slm $H_2$, 750–800° C., 20 Torr, 150–200 sccm HCl, diborane flow of 150–200 sccm and $GeH_4$ flow of 150–200 sccm, a highly doped silicon germanium film with a deposition rate of 20 nanometers per minute, a boron concentration of $1E20\ cm^{-3}$, and a germanium concentration of 20 percent may be achieved in one embodiment. A low resistivity of 0.7–0.9 mOhm-cm results from the high boron concentration of the film.

Low resistivity provide the benefit of high conductivity in the extension and source/drain regions in some embodiments. This lowered resistivity may reduce the external resistance. The larger unit cell of the silicon germanium present in source/drain regions 50b may exert compressive strain on the channel, which in turn may result in enhanced mobility and transistor performance in some embodiments.

In the N-type transistor (NMOS), the source/drain 50b and source/drain extension 50a may be formed using in situ phosphorus doped silicon deposited in one embodiment. The silicon may be deposited selectively under processing conditions of 100 sccm of dichlorosilane, 25–50 sccm HCl, 200–300 sccm of 1 percent PH$_3$ with a H$_2$ gas carrier flow of 20 slm at 750° C. and 20 Torr. A phosphorous concentration of 2E20 cm$^{-3}$ with a resistivity of 0.4–0.6 mOhm-cm may be achieved in the deposited film in one embodiment.

Figure 5:
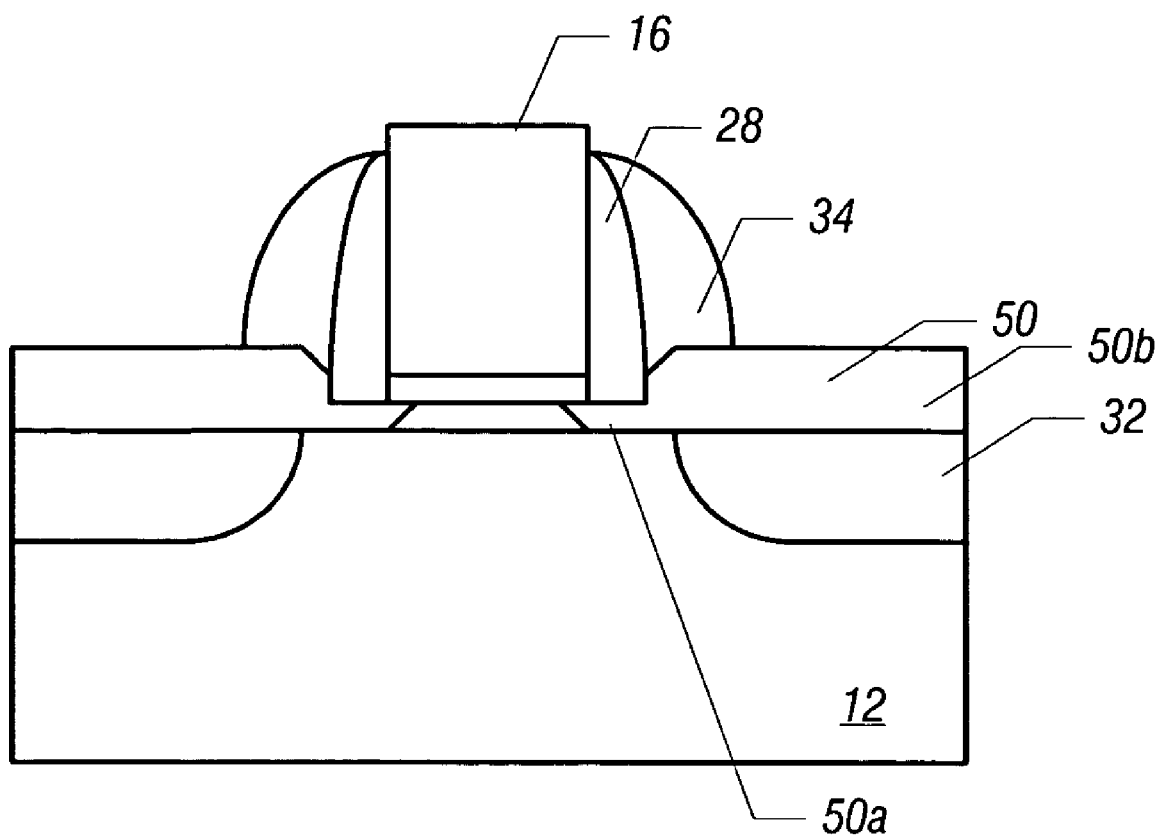
FIG. 5 is an enlarged, cross-sectional view at still a subsequent stage of manufacture in accordance with one embodiment of the present invention.

Thereafter, a second thin spacer 34 may be formed using conventional techniques as shown in FIG. 5. A deep source/drain 32 may be formed by ion implantation using the spacers 28 and 34 and the gate 16 as a mask. The annealing of the deep source/drain 32 may be done in a way that reduces or minimizes the dopant diffusion including the dopant in the layer 50.

The characteristics of the shallow source/drain extensions 50a and the degree by which they underlap the gate 16 may be independent of the characteristics of the deep source/drain junction 32. The extent of extension underlap of the gate 16 of the source/drain extension 50a may be controlled as desired.

While the present invention has been described with respect to a limited number of embodiments, those skilled in the art will appreciate numerous modifications and variations therefrom. It is intended that the appended claims cover all such modifications and variations as fall within the true spirit and scope of this present invention.

The invention claimed is:

1. A method comprising:
   forming a sacrificial epitaxially deposited material over a substrate;
   forming a gate electrode over said epitaxially deposited material; and
   selectively etching said epitaxially deposited material.

2. The method of claim 1 further comprising:
   forming a metal oxide semiconductor field effect transistor having an epitaxially deposited source/drain that extends under the edges of a gate electrode.

3. The method of claim 2 including forming a source/drain extension that extends under the edges of a gate electrode.

4. The method of claim 1 wherein forming a sacrificial epitaxially deposited material includes epitaxially depositing a silicon material.

5. The method of claim 1 including using sonication to selectively etch said material.

6. The method of claim 1 including forming a sidewall spacer on said gate electrode and etching under said sidewall spacer.

7. The method of claim 1 including selectively etching said epitaxially deposited material so as to undercut said gate electrode.

8. The method of claim 7 including depositing an epitaxial material on said substrate and extending under said gate electrode.

9. The method of claim 8 including forming a doped epitaxial material.

10. The method of claim 7 including forming said epitaxial material to be thinner near the gate electrode and thicker spaced from said gate electrode.

11. The method of claim 2 including forming a delta doped transistor.

12. A method comprising:
    forming a epitaxial semiconductor layer over a semiconductor substrate wherein the epitaxial semiconductor layer has a lower doping concentration than the substrate;
    forming a gate structure including a gate electrode and a sidewall spacer over said epitaxial semiconductor layer; and
    selectively etching the exposed portion of said epitaxial semiconductor layer as well as a portion of said epitaxial semiconductor layer under said gate electrode.

13. The method of claim 12 including epitaxially depositing a doped semiconductor material over said substrate to fill the region under said gate electrode and under said sidewall spacer.

14. The method of claim 13 wherein said epitaxial semiconductor layer has a first thickness under said gate electrode and a second thickness spaced from said gate electrode.

15. The method of claim 14 including forming said second thickness in alignment with said spacer.

16. The method of claim 12 including forming a deep source/drain region by ion implantation.

17. The method of claim 12 including forming said epitaxial semiconductor layer extending under said gate electrode and having a greater thickness outbound of said gate electrode and a lesser thickness under said gate electrode.

* * * * *